(12) United States Patent
Delaet et al.

(10) Patent No.: US 8,148,709 B2
(45) Date of Patent: Apr. 3, 2012

(54) MAGNETIC DEVICE WITH INTEGRATED MAGNETO-RESISTIVE STACK

(75) Inventors: Bertrand Delaet, Bernin (FR);
Marie-Claire Cyrille, Sinard (FR);
Jean-François Nodin, Saint Egreve (FR); Véronique Sousa, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 334 days.

(21) Appl. No.: 12/366,011

(22) Filed: Feb. 5, 2009

(65) Prior Publication Data

US 2009/0250775 A1    Oct. 8, 2009

(30) Foreign Application Priority Data

Apr. 3, 2008  (FR) ...................... 08 52236

(51) Int. Cl.
*H01L 47/00* (2006.01)
(52) U.S. Cl. ....... 257/4; 257/42; 257/762; 257/E27.006; 257/E21.665; 257/E45.002
(58) Field of Classification Search ................. 438/421, 438/425, 467; 257/42, 616, 2, 4, 5, 749, 257/762, E43.004, E29.323, 295, 421, E27.006, 257/E21.665, E45.002; 331/157; 365/8, 365/33, 158
See application file for complete search history.

(56) References Cited

U.S. PATENT DOCUMENTS

| | | | |
|---|---|---|---|
| 6,730,949 B2 * | 5/2004 | Kishi et al. ..................... 257/295 |
| 6,878,569 B2 * | 4/2005 | Li .................................. 438/95 |
| 6,888,155 B2 * | 5/2005 | Campbell ........................ 257/2 |
| 6,963,500 B2 * | 11/2005 | Tsang ........................... 365/171 |
| 7,732,881 B2 * | 6/2010 | Wang ............................. 257/421 |
| 2003/0068861 A1 * | 4/2003 | Li et al. ........................ 438/257 |
| 2007/0236105 A1 | 10/2007 | Mancoff et al. |
| 2008/0031035 A1 * | 2/2008 | Rodmacq et al. ............. 365/171 |
| 2008/0241597 A1 | 10/2008 | Dieny et al. |
| 2009/0073749 A1 * | 3/2009 | Dittrich et al. ................ 365/158 |
| 2009/0173977 A1 * | 7/2009 | Xiao et al. ..................... 257/295 |
| 2009/0219754 A1 * | 9/2009 | Fukumoto ..................... 365/158 |
| 2009/0244960 A1 * | 10/2009 | Saito et al. .................... 365/158 |

(Continued)

FOREIGN PATENT DOCUMENTS

FR    2 892 871 A1    5/2007

(Continued)

OTHER PUBLICATIONS

Shehzaad Kaka, et al., "*Mutual Phase-Locking of Microwave Spin Torque Nano-Oscillators*," Nature, vol. 437, Sep. 15, 2005, pp. 389-392.

(Continued)

*Primary Examiner* — Matthew Landau
*Assistant Examiner* — Joseph C Nicely
(74) *Attorney, Agent, or Firm* — Burr & Brown

(57) ABSTRACT

This magnetic device integrates a magneto-resistive stack, the stack comprising at least two layers made out of a ferromagnetic material, separated from each other by a layer of non-magnetic material; and means for causing an electron current to flow perpendicular to the plane of the layers, with at least one integrated nano-contact intended to inject the current into the magneto-resistive stack. The nano-contact is made in a bilayer composed of a solid electrolyte on which has been deposited a soluble electrode composed of a metal that has been at least partially dissolved in the electrolyte.

12 Claims, 2 Drawing Sheets

U.S. PATENT DOCUMENTS

2010/0118600 A1* 5/2010 Nagase et al. ............... 365/158
2010/0134196 A1* 6/2010 Cyrille et al. ............... 331/157

FOREIGN PATENT DOCUMENTS

WO        2005/064783  A2     7/2005
WO    WO 2007052240  A2 *   5/2007

OTHER PUBLICATIONS

F.B. Mancoff, et al., "*Phase-Locking in Double-Point-Contact Spin-Transfer Devices*," Nature, vol. 437, Sep. 15, 2005, pp. 393-395.

\* cited by examiner

MAGNETIC DEVICE WITH INTEGRATED MAGNETO-RESISTIVE STACK

FIELD OF THE INVENTION

The present invention relates to the field of magnetic tunnel junction or spin valve magnetic components, such as those used in radio-frequency oscillators, but also used in magnetic random access memories, enabling data to be stored, read and written, in a known way, in electronic systems.

Radio-frequency oscillators, in respect of which the invention finds application, are devices intended to operate in frequency ranges between a GHz and tens of GHz, such radio-frequency oscillators being more particularly used in the telecommunications field.

The invention also applies to non-volatile magnetic random access memories, traditionally known by the acronym MRAM, constituted by a set of memory points each formed by a magnetic tunnel junction, also known by the acronym MTJ.

BACKGROUND OF THE INVENTION

Of the different magnetic devices known hitherto and more particularly intended to constitute MRAM memories or radio-frequency oscillators, those said to operate with spin transfer are known. Their operation is based on giant magneto-resistance effects, as for spin valves, and on tunnel magneto-resistance effects, as for magnetic tunnel junctions MTJ.

These structures consist of a stack of magnetic layers, whereof the nature and the arrangement are implemented in such a way that when an electric current passes through them, it is possible to obtain a variable resistance as a function of the magnetic field applied and/or of the spin-polarized current passing through them.

Such a device is constituted by stacking two ferromagnetic layers separated by a non-magnetic layer conventionally known as a spacer, made out of metal for spin valves or oxide for magnetic tunnel junctions.

In a known way, when the direction of magnetization of the two ferromagnetic layers is identical, in what are then referred to as parallel directions, the device is in the low-resistance state. Consequently, when the direction of the two ferromagnetic layers is anti-parallel, the device is in the so-called high-resistance state.

Spintronics uses electron spin as an additional degree of freedom, to generate new effects. Electron spin causes magneto-resistive phenomena in the magnetic multi-layers, such as in particular giant magneto-resistance or tunnel magneto-resistance.

It has in fact been possible to show that by passing a spin-polarized current through a thin magnetic layer, a reversal of its magnetization could be induced in the absence of any external magnetic field. The spin-polarized current may also generate sustained magnetic excitations, also known as oscillations. The use of the effect of generating sustained magnetic excitations in a magneto-resistive device allows this effect to be converted into a high-frequency voltage modulation that can be directly used in electronic circuits, and is therefore as a consequence able to intervene directly at frequency level.

The magneto-resistive stacks providing both said oscillators and memory points for magnetic memories use two different techniques:

so-called "pillar" stacks: all the layers are etched to make a pillar about 50 to 300 nm in diameter;

so-called "contact point" stacks: in a stack of this kind, the active and particularly ferromagnetic layers are not etched with nanometric patterns or, if they are, are then manufactured in accordance with very large patterns (typically in the vicinity of a square micrometer). A very tight metal contact is made, typically 20 to 50 nm, above the magnetic stack using an external or internal nanotip.

Stacks of the second aforementioned type, also called "nano-contacts" are preferred, particularly when spin valves are employed in order to make radio-frequency oscillators, since they produce better defined radio-frequency emissions and particularly sharper radio-frequency emissions. It has in fact been possible to observe a reduction in the width of the radio-frequency emission lines, a reduction attributed to the minimization of the edge effects inherent in the method of manufacture.

Moreover, using nano-contacts means that the integration density of the magnetic devices can be increased and the current can be confined in the magnetic layers allowing a homogenization of the physical effects, as well as a reduction in bipolar interference fields. In the particular context of producing radio-frequency oscillators, the use of nano-contacts allows very high $Q=f/\Delta f$ quality factors to be obtained.

In fact, radio-frequency oscillators of this kind are, as has already been said, more particularly employed in the context of telecommunications devices, such as in particular cell telephones in respect of which more and more work is being done on applying the dynamic frequency allocation principle to resolve the problem caused by the saturation of the frequency bands assigned to the telecommunications sector. And, to implement said dynamic frequency allocation principle, very wide band oscillators are needed that offer very good phase noise performance, and consequently require a very high quality factor Q.

Technologically speaking, nano-contacts of this kind cannot be put into mass production using current technology. Said technology in fact demands tools that are very cumbersome to use, such as an FIB (focused ion beam) and electroplating, AFM (Atomic Force Microscope) tips to make nano-indentations, in other words a method for making orifices one by one in a planarizing resin, EBEAM (electron beam)/metal etching/planarization or again EBEAM/oxide etching/filling photolithography sequences, particularly when it is required to obtain contact dimensions well below 50 nm.

The objective targeted by the present invention is to make nano-contacts of this kind in magnetic stacks, and to do so, using another technology, that can be more easily adapted to mass production and allows component integration to be optimized.

SUMMARY OF THE INVENTION

The invention is intended to find a solution to the problem posed, by opting to use a bilayer, constituted by a soluble electrode, dissolved at least partially in a solid electrolyte, and which, subsequent to this dissolution, and as a function of electrical parameters applied to the stack provided or coated with said bilayer, will allow a conductive path to be generated that has particularly reduced dimensions and is, in any case, compatible with the objectives sought.

More particularly, the invention targets a magnetic device integrating:

a magneto-resistive stack, said stack comprising at least two layers made out of a ferromagnetic material, separated from each other by a layer of non-magnetic material;

and means for causing an electron current to flow perpendicular to the plane of said layers, with at least one integrated nano-contact intended to inject said current into the magneto-resistive stack.

According to the invention, the nano-contact is made in a bilayer composed of a solid electrolyte on which has been deposited a soluble electrode composed of a metal, and at least partially dissolved in the electrolyte.

By using a solid electrolyte/soluble electrode bilayer of this kind between the magnetic stack and one of the contact electrodes routing an electric current, a conductive path is created under certain polarization conditions that is particularly limited in size, typically limited to a few atoms and at most in the vicinity of a few nanometers.

The difficulties inherent in traditional technologies for the production of nano-contacts of this kind are therefore avoided and at the same time the physical advantages derived from using these nano-contacts as stated in the introduction can be enjoyed, and this is true in terms of producing both magnetic memories and radio-frequency oscillators.

According to the invention, the electric current passing through the magnetic stack can be spin polarized.

According to the invention, the electrolyte is constituted by a chalcogenide and more particularly chosen from the group comprising GeSe or GeS or GeTe or $As_2Se$.

The soluble electrode is selected from the group comprising silver, copper, cobalt, zinc, indium and platinum.

In a known way, when the bilayer so produced is subject to a UV treatment or heat treatment phase (in a furnace at between 100 and 400° C., depending on the material used and the annealing time), the result is a dissolution, namely that part of the soluble electrode is dissolved in the solid electrolyte to constitute an isolating matrix of the type MGeS or MGeSe or MGeTe or $MAs_2Se$, in which M denotes the dissolved metal coming from the soluble electrode.

In a known way, as a function of the voltage applied to the terminals of such a matrix, two operating modes are able to be implemented.

Firstly, if sufficient voltage is applied, i.e. above a threshold voltage denoted $V_{th}$, corresponding to the minimum voltage to be applied below which nothing happens, and typically between 0.2V and 1V, a conductive path is created through the matrix, the at most nanometric size and electrical resistance of which are dependent on the electric current passing through the matrix, and known as the compliance current $I_{comp}$.

So, as long as the current passing through the matrix does not exceed a so-called saturation current $I_{sat}$, i.e. the current above which the conductive path is permanently created, with the resistance no longer varying at all and typically between a few mA and 100 mA, the nano-contact also known as the conductive nano-path can be erased and rewritten.

On the other hand, if the saturation current $I_{sat}$ is exceeded, the nano-contact or conductive nano-path is irreversibly created, and therefore becomes permanent. In this configuration, both its size and its electrical resistance are fixed by the saturation current $I_{sat}$.

According to one particular embodiment of the invention, between the stack of magnetic layers and one of the contact electrodes is mounted a network of nano-contacts, each constituted by a bilayer of the same type as the one previously described, said networks being mounted in parallel or in series. This form of embodiment is more particularly intended for the production of spin-transfer radio-frequency oscillators.

According to another inventive alternative, the bilayer of the type previously described is made to act as polarizer in the context of producing a radio-frequency oscillator. In other words, by specially selecting said bilayer, and more particularly the metal constituting the soluble electrode, and particularly if this is cobalt, a very high degree of shape anisotropy is conferred on the resulting matrix thereby enabling the polarizer function to be transferred from the magnetic stack to said matrix.

According to yet another inventive embodiment, the inventive bilayer is employed on either side of the magnetic stack. By doing this, nano-contacts of reduced dimensions are then created, leading to an optimization of the confinement of the current lines and thereby improving the effectiveness of the device.

BRIEF DESCRIPTION OF THE DRAWINGS

The manner in which the invention can be implemented and the advantages stemming from it will emerge more clearly from the following embodiment examples, given for information only and non-restrictively, supported by the following figures.

DETAILED DESCRIPTION OF THE INVENTION

Figure 1:
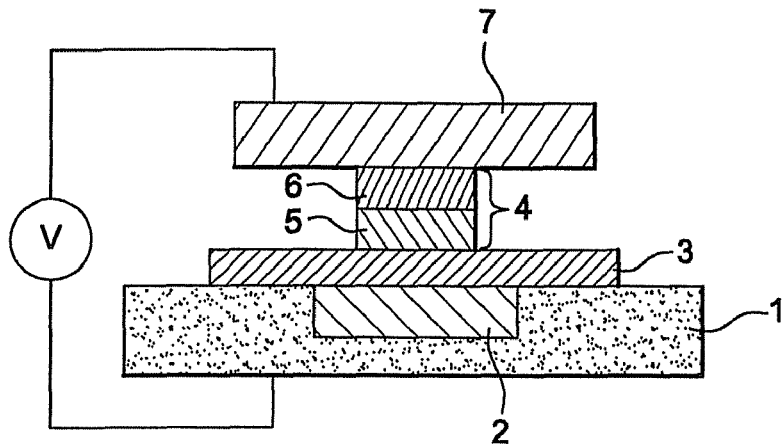
FIG. 1 is a diagrammatic representation of the general principle underpinning the present invention.

A typical inventive embodiment has been described in relation to FIG. 1, intended for both a spin valve magnetic stack and a magnetic tunnel junction.

Integrated therein, in a substrate 1, typically made of silicon, is the electric conductive lower electrode 2, intended to route the electric current for reading or writing, in the case of a magnetic memory, or for inducing precession of the magnetization of one of the layers of a magnetic stack 3, described below in greater detail, in the case of a radio-frequency oscillator.

The stack 3 is applied to the substrate, and is of a type known per se.

Where a magnetic tunnel junction is involved, it comprises two layers of ferromagnetic materials such as in particular CoFe or NiFe alloys. These two layers are separated from each other either by an isolating material, in particular an oxide such as alumina for example, to form a magnetic tunnel junction, or by a metal, copper for example, to make a spin valve.

Typically, this magnetic stack has a width, or a diameter of several microns and a thickness in the vicinity of 50 nanometers.

According to one characteristic of the invention, this magnetic stack 3 is not directly in contact with the upper electrode 7, intended in cooperation with the lower electrode 2 to enable an electric current to pass perpendicular to the plane of the layers of the magnetic stack 3, but, comes into contact with a bilayer 4, constituted prior to any treatment by a solid electrolyte 5 and a soluble electrode 6 respectively.

In the example described, the solid electrolyte 5 is for example constituted by a chalcogenide GeSe or GeS or GeTe or $As_2Se$ of a thickness varying between 5 and 50 nanometers. It is deposited on the magnetic stack 3. This deposition may be implemented using conventional techniques, such as PVD (Phase Vapour Deposition), CVD (Chemical Vapour Deposition), or by evaporation, for both the solid electrolyte and the soluble electrode. This deposition therefore comes into contact with one of the ferromagnetic layers of the magnetic stack.

As a consequence, the soluble electrode 6 is constituted of silver or copper or zinc or indium and platinum, and also has a thickness of between 5 and 50 nanometers before dissolution treatment.

The width or diameter of this bilayer 4 is more than 45 nanometers, and may typically reach 300 nanometers (depending on the precision available for the lithography).

In order to end up with the creation of a conductive nano-path, i.e. a nano-contact, reversible or irreversible, the bilayer so constituted is firstly subjected to ultra-violet treatment or heat treatment, leading to the at least partial dissolution of the layer 6 constituting the soluble electrode in the solid electrolyte 5. Doing this leads for example to the formation of a CuGeSe or CuGeS or AgGeSe or AgGeS matrix. The thickness of the electrode is not changed in any notable way.

The conductivity of the solid electrolyte before treatment to dissolve the soluble electrode is in the vicinity of $10^{-11} \Omega^{-1}$ $m^{-1}$ As a consequence, after treatment to dissolve the soluble electrode in the solid electrolyte, conductivity of about $10^{-2}$ $\Omega^{-1} m^{-1}$ is attained.

On the other hand, if the entire stack as described in relation to FIG. 1 is subjected to a voltage above the threshold voltage $V_{th}$, which is typically between 0.2 Volt and 1 Volt, the resistivity becomes greater than $10^5 \Omega^{-1} m^{-1}$ leading to a resistance of the nano-contact or nano-contacts being formed in the matrix of close to between a few ohms and a few tens of ohms.

The upper electrode 7 is generally deposited after dissolution. However, current techniques make it possible to envisage this electrode being deposited prior to dissolution of the soluble electrode.

As already indicated in the introduction, it is possible to subject the device so produced to two different systems, depending on the use envisaged.

So, by keeping the device at a voltage above the threshold voltage $V_{th}$, but taking care to ensure the unit is passed through by an electric compliance current weaker than the saturation current, typically in the vicinity of between 10 and 100 milliamperes in the example described, the nano-path or nano-paths produced in the bilayer 4 are reversible and may in particular be erased and then rewritten during the new subsequent power-up state. The size and resistance of the conductive nano-path so produced in the bilayer 4 are directly dependent on the compliance current at initialization. To erase this nano-contact or conductive nano-path, all that is needed is to change the direction of polarization and to exceed the erasure voltage, typically of between −50 mV and −500 mV, this voltage being predetermined experimentally by negative scanning. To re-initialize, it is advisable on the other hand to always apply a voltage above the threshold voltage $V_{th}$.

According to this operating mode, i.e. with a current path that can be adjusted and/or re-programmed, a degree of additional freedom can be conferred in respect of controlling this device. Thus, when making a spin transfer radio-frequency oscillator, controlling the size and the resistance of the conductive filament or conductive nano-path through the particular choice of compliance current enables the current density and consequently, the frequency operating range, to be adjusted. Oscillator functionality is increased by giving access to different frequency operating modes according to the size of the nano-contact and therefore of the current density.

The other operating mode of such a device amounts to constituting a permanent or irreversible conductive nano-path. To do this, at initialization, it is advisable always to apply a voltage $V > V_{th}$ and in addition, to cause a current $I > I_{sat}$ to flow. The conductive nano-path or nano-contact is, in this configuration, irreversibly created and therefore becomes permanent. The size and resistance thereof are then fixed by the saturation current. This operating mode is more particularly used to make nano-contacts for high coherence and low line width RF oscillators, but also to make MRAM.

The advantage of this mode is being able to have a quite particularly localized current injection, one particularly limited to a few atoms or to a few nanometers as a function of the compliance current injected ($I_{sat}$) without however losing in electrical conductivity.

Moreover, this operating mode leads to very good integration and therefore to confinement. This technology proves furthermore relatively easy to apply in terms of mass production on account of the simplicity of manufacture: straightforward deposition techniques, dissolution stage. Furthermore, it leads to high integration density, as well as a self-alignment of the nano-contact on the magnetic stack on account of the technique of depositing the bilayer 4 on said stack 3. Lastly, it enables oscillator performance to be optimized, on account of the extremely localized current injection.

Figure 2:
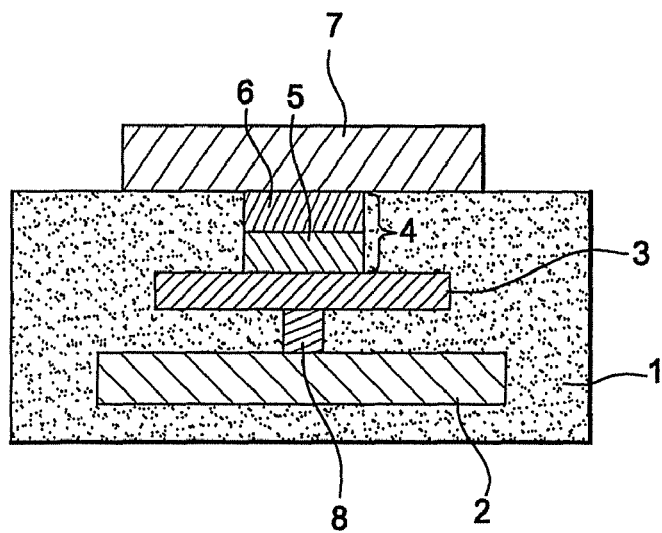
FIGS. 2 and 3 are alternative embodiments of the invention.
Figure 3:
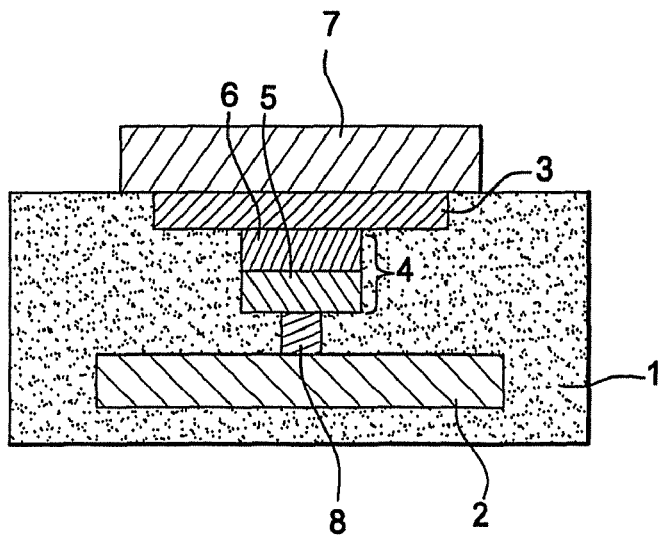

In FIGS. 2 and 3 has been shown an alternative to the structure previously described. Thus, between the lower electrode and magnetic stack can be inserted a plug 8, made out of tungsten or copper for example and suitable for promoting the confinement of the electric current through the stack. This plug can be positioned between the lower electrode 2 and the magnetic stack 3 (FIG. 2), or between the lower electrode 2 and the bilayer 4 (FIG. 3). The embodiment in FIG. 2 is more particularly suitable for confining the current in the magnetic layers. It also affords the advantage that the different depositions can be applied in situ.

The objective of the embodiment in FIG. 3 is to show another technological alternative that implements a step of planarizing the chalcogenide depositions before the magnetic layers are deposited.

According to another inventive alternative, more particularly intended for the production of a radio-frequency oscillator, the electric current spin polarization function is at least partially transferred from one of the ferromagnetic layers constituting the magnetic stack 3 to the bilayer 4 resulting from the bilayer.

To this end, the copper or silver constituting the soluble electrode 6 are replaced by cobalt, and dimensions are kept substantially similar to those, as previously described, of the two respective layers, solid electrolyte and soluble electrode. By so doing, the matrix within which a nano-contact is made, as previously indicated, also acts as a perpendicular polarizer with a very high degree of shape anisotropy, thereby suitable for optimizing the electrical resistance modulation resulting from the spin polarized current passing through the magnetic stack 3. This configuration means that the spins can be polarized perpendicular to the magnetizations of the free and trapped ferromagnetic layers of the spin valve or magnetic tunnel junction. The advantage of employing a perpendicular polarizer lies firstly in the reduction in the critical current (necessary for the precession or reversal of the magnetization of the ferromagnetic layer), and then, in obtaining more output signal from the RF voltage in the spin transfer oscillators and, finally, in the possibility of obtaining zero magnetic field oscillations.

Figure 4:
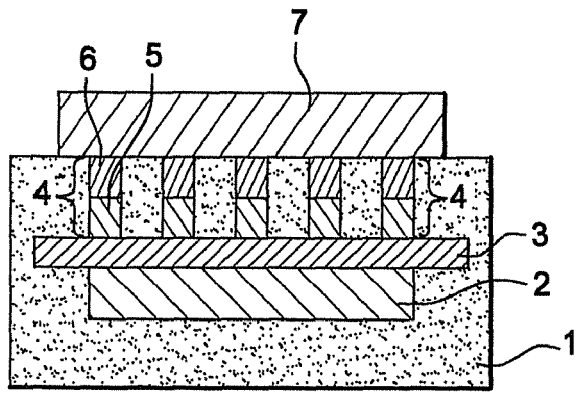
FIGS. 4, 5 and 6 are diagrammatic representations intended to show a network of nano-contacts.
Figure 5:
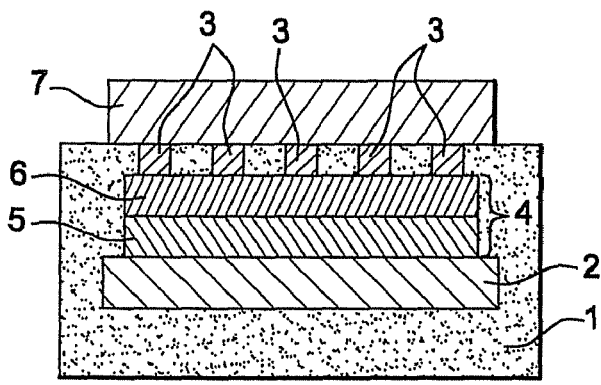

Another conceivable inventive use has been shown in relation to FIGS. 4 and 5, in which a network of nano-contacts is employed in parallel, instead and in place of a single nano-contact as described in relation to FIGS. 1 to 3. Here too, this configuration is more particularly intended for making spin-transfer radio-frequency oscillators.

This embodiment is based on the same principle of manufacture as that described in relation to FIG. 1, except that instead of patterning (in the case in point lithography, etching, oxide filling and planarization) one pattern under the upper electrode, a plurality thereof are patterned. (There is only one bilayer which is etched to give a plurality of patterns).

As an alternative, onto the lower electrode is deposited a single bilayer 4, and a single magnetic stack 3, this stack being etched so as to obtain a multitude of patterns, the patterns being separated here too from each other by a silica insulator, the patterns then being in contact with the upper electrode which is made of copper for example.

This structure enables the effectiveness of the radio-frequency oscillator employing such configurations to be increased. Indeed, it leads in this case to the employment of N oscillators coupled to each other. The output power is greatly increased as a result and in the event, is proportionate to $N^2$, and the quality factor also increases. Such a network of nano-oscillators is for example described in the publication [*Mutual phase-locking of microwave spin torque nano-oscillators*, S. KAKA et al., Nature vol. 437, p. 389, 2005 or *Phase Locking in double point contact spin transfer devices*, F. B. Mancoff et al., Nature Vol. 437, p. 393, 2005].

Figure 6:
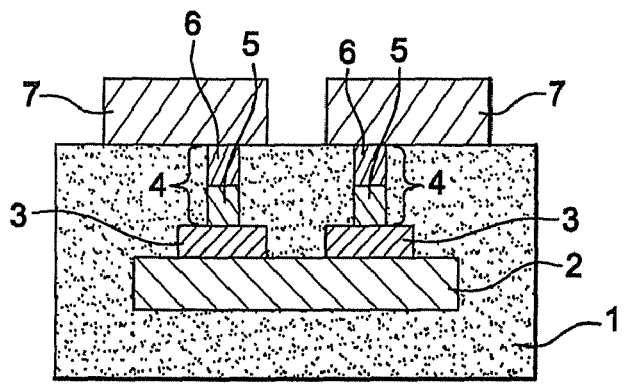

Another conceivable inventive configuration has been shown in relation to FIG. 6, in which the nano-contacts are no longer in parallel but in series. Under this assumption, as can be seen, the upper electrode is no longer continuous but is constituted by a plurality of electrodes isolated from each other. This configuration constitutes another embodiment example for connecting N oscillators.

It is possible, by using the previously described reversible and programmable operating mode, i.e. with $I_{comp} < I_{sat}$, to improve and above all to control the coupling by controlling the density of the current of each nano-contact injected into the stack or into the electromagnetic stacks 3, and more particularly so, if the electrodes for controlling the nano-contacts are independent (i.e. if each nano-oscillator can be polarized independently). In this event the polarizations are adjusted at individual nano-contact level to give optimum coupling between the nano-oscillators.

Figure 7:
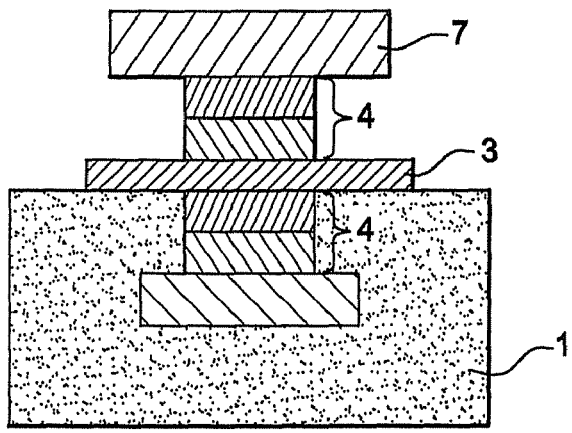
FIG. 7 is a diagrammatic representation of another alternative embodiment of the invention, showing the implementation of a double nano-contact.

According to yet another configuration, shown in relation to FIG. 7, a bilayer 4 of the same type as the one previously described is arranged on either side of the magnetic stack 3, with the solid electrolyte 5 of each of these bilayers in contact with the two opposing faces of the magnetic stack 3. The dimensions of the respective layers remain substantially equivalent to those previously indicated. In doing this, because such nano-contacts are employed on either side of the stack, the confinement of the current lines passing through the magnetic stack is optimized, and as a result, the performance of the resulting device is improved. As already stated, by so confining the current lines, it is possible to attain a homogenization of the physical effects through the absence of or at least a drastic reduction in edge effects and moreover, the integration density of these devices is increased, an ongoing concern of the man skilled in the art in the field under consideration.

The invention claimed is:

1. A magnetic device comprising:
    a magneto-resistive stack, said stack comprising at least two layers made out of a ferromagnetic material, separated from each other by a layer of non-magnetic material; and
    means for causing an electron current to flow perpendicular to the plane of said layers, with at least one integrated nano-contact intended to inject said current into the magneto-resistive stack, said nano-contact being made in a bilayer composed of a solid electrolyte on which has been deposited a soluble electrode composed of a metal that has been at least partially dissolved in said electrolyte,
    wherein said bilayer has a width between 45 and 300 nm.

2. The magnetic device as claimed in claim 1, wherein the electric current passing through the magnetic stack is spin polarized.

3. The magnetic device as claimed in claim 1, wherein the soluble electrode is at least partially dissolved in the solid electrolyte by UV treatment or heat treatment.

4. The magnetic device as claimed in claim 1, wherein the solid electrolyte is constituted by a chalcogenide, and more particularly selected from the group consisting of GeSe, GeS, GeTe, and $As_2Se$.

5. The magnetic device as claimed in claim 1, wherein the soluble electrode is selected from the group consisting of silver, copper, cobalt, indium, zinc and platinum.

6. The magnetic device as claimed in claim 1, wherein the voltage applied to terminals of the magnetic device exceeds a threshold voltage ($V_{th}$), and wherein the electron current passing through said magnetic stack is weaker than the saturation current and is controllable, as a function of the required size of the nano-contact or nano-contacts produced in the bilayer.

7. The magnetic device as claimed in claim 1, wherein the voltage applied at terminals of the magnetic device exceeds a threshold voltage ($V_{th}$), and wherein the electron current passing through said magnetic stack is stronger than the saturation current, in such a way as to produce irreversible nano-contacts in the bilayer.

8. The magnetic device as claimed in claim 1, further comprising, between the stack of magnetic layers and one of the contact electrodes constituting said means for causing an electron current to flow perpendicular to the plane of said layers, a network of nano-contacts, each constituted by a bilayer, said network being mounted in parallel or in series.

9. The magnetic device as claimed in claim 1, wherein a bilayer is positioned on either side of the magnetic stack, the solid electrolyte of each of said bilayers being in contact with said stack, on the opposing faces thereof.

10. A magnetic random access memory constituted by a plurality of memory points, wherein each memory point is constituted by a magnetic device as claimed in claim 1.

11. A radio-frequency oscillator comprising a magnetic device as claimed in claim 1.

12. The radio-frequency oscillator as claimed in claim 11, wherein the soluble electrode is made out of cobalt, the bilayer of said device acting as polarizer.

* * * * *